United States Patent
Wu et al.

(10) Patent No.: US 9,775,246 B2
(45) Date of Patent: Sep. 26, 2017

(54) CIRCUIT BOARD AND MANUFACTURING METHOD THEREOF

(71) Applicant: Unimicron Technology Corp., Taoyuan (TW)

(72) Inventors: Kuan-Hsi Wu, Taoyuan (TW); Pi-Te Pan, Taoyuan (TW); Chang-Fu Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 31 days.

(21) Appl. No.: 14/820,572

(22) Filed: Aug. 7, 2015

(65) Prior Publication Data
US 2017/0042026 A1    Feb. 9, 2017

(51) Int. Cl.
*H05K 1/11* (2006.01)
*H05K 3/30* (2006.01)
*H05K 1/02* (2006.01)
*H05K 3/10* (2006.01)
*H05K 3/00* (2006.01)
*H05K 3/40* (2006.01)

(52) U.S. Cl.
CPC .......... *H05K 1/119* (2013.01); *H05K 1/0298* (2013.01); *H05K 1/116* (2013.01); *H05K 3/0023* (2013.01); *H05K 3/10* (2013.01); *H05K 3/303* (2013.01); *H05K 3/4007* (2013.01); *H05K 2201/0367* (2013.01); *H05K 2203/0562* (2013.01)

(58) Field of Classification Search
CPC ........ H05K 1/0296; H05K 1/119; H05K 1/11; H05K 1/181; H05K 3/303; H05K 3/305
See application file for complete search history.

(56) References Cited

U.S. PATENT DOCUMENTS

2010/0213605 A1*  8/2010  Shimizu .............. H01L 21/6835
257/700

FOREIGN PATENT DOCUMENTS

| TW | 200409254 | 6/2004 |
| TW | 200610171 | 3/2006 |
| TW | 201010049 | 3/2010 |
| TW | 201324727 | 6/2013 |

OTHER PUBLICATIONS

"Office Action of Taiwan Counterpart Application", issued on Apr. 8, 2016, p. 1-p. 4.

* cited by examiner

*Primary Examiner* — Jeremy C Norris
(74) *Attorney, Agent, or Firm* — Jianq Chyun IP Office

(57) ABSTRACT

A circuit board including a substrate, a photo imageable dielectric layer and a plurality of conductive bumps is provided. The substrate has a first surface and a first circuit layer, wherein the first surface has a chip disposing area and an electrical connection area, and the first circuit layer is embedded in the first surface. The photo imageable dielectric layer is disposed on the electrical connection area and has a plurality of openings, wherein parts of the first circuit layer is exposed by the openings. The conductive bumps are disposed at the openings respectively and connected to the first circuit layer, wherein a side surface of each of the conductive bumps is at least partially covered by the photo imageable dielectric layer. In addition, a manufacturing method of the circuit board is also provided.

10 Claims, 7 Drawing Sheets

CIRCUIT BOARD AND MANUFACTURING METHOD THEREOF

BACKGROUND OF THE INVENTION

Field of the Invention

The invention relates to a circuit board and a manufacturing method thereof, and particularly relates to a circuit board having a photo imageable dielectric layer and a manufacturing method thereof.

Description of Related Art

Along with quick development of technology, integrated circuits (ICs) are widely applied in people's daily life. Generally, production of the ICs mainly includes three stages: manufacturing of silicon wafers, manufacturing of the ICs and packaging of the ICs. In view of a present package structure, package on package (POP) is a commonly used package type.

To be specific, a chip package is fixed on another chip package through a plurality of conductive bumps, and is electrically connected to the other chip package through the conductive bumps. In recent years, as the number of input/output (I/O) terminals required on a circuit board is gradually increased, a layout density of the conductive bumps is accordingly increased, so that demand on manufacturing precision of the conductive bumps is also enhanced. Moreover, since the chips have a certain thickness, the conductive bumps supporting between two chip packages are required to have an enough height, so as to provide an adequate space between the two chip packages for accommodating the chips. However, since the conductive bumps are required to have a higher height, side surfaces of the conductive bumps are liable to be excessively exposed to external environment to increase a risk that the conductive bumps are oxidized or eroded, which influences a yield of the chip package products.

SUMMARY OF THE INVENTION

Accordingly, the invention is directed to a circuit board and a manufacturing method thereof, in which conductive bumps have better manufacturing precision, and the conductive bumps are avoided to be excessively exposed to external environment.

The invention provides a circuit board including a substrate, a photo imageable dielectric layer and a plurality of conductive bumps. The substrate has a first surface and a first circuit layer, wherein the first surface has a chip disposing area and an electrical connection area, and the first circuit layer is embedded in the first surface. The photo imageable dielectric layer is disposed on the electrical connection area and has a plurality of openings, wherein the openings expose parts of the first circuit layer. The conductive bumps are respectively disposed at the openings and are connected to the first circuit layer, wherein the photo imageable dielectric layer covers at least a part of a side surface of each of the conductive bumps.

In an embodiment of the invention, the circuit board further includes a solder mask layer disposed on the photo imageable dielectric layer and covering a part of the side surface of each of the conductive bumps.

In an embodiment of the invention, the circuit board further includes a connection circuit disposed on the photo imageable dielectric layer and connecting two of the conductive bumps, wherein the solder mask layer covers the connection circuit.

In an embodiment of the invention, each of the conductive bumps includes an embedded portion and a pad portion, wherein the embedded portion is located in the corresponding opening, the pad portion is connected to the embedded portion and located outside the corresponding opening, and a thickness of the pad portion is smaller than 30 μm.

In an embodiment of the invention, each of the conductive bumps includes an embedded portion and a pad portion, wherein the embedded portion is located in the corresponding opening, the pad portion is connected to the embedded portion and located outside the corresponding opening, and a thickness of the pad portion is smaller than a thickness of the embedded portion.

In an embodiment of the invention, the substrate includes a base layer and a built-up structure. The base layer includes a first dielectric layer, the first circuit layer, a second circuit layer and a plurality of first conductive vias, wherein the first dielectric layer has a first surface and a second surface opposite to each other, the second circuit layer is disposed on the second surface, and each of the first conductive vias is located in the first dielectric layer and connects the first circuit layer and the second circuit layer. The built-up structure is formed on the second surface and includes at least one second dielectric layer and a conductive structure formed on the second dielectric layer, wherein the conductive structure at least includes a plurality of second conductive vias formed in the second dielectric layer and extending to the second circuit layer and a third circuit layer formed on a part of the second dielectric layer.

The invention provides a manufacturing method of a circuit board, which includes following steps. A substrate having a first surface and a first circuit layer is provided, wherein the first surface has a chip disposing area and an electrical connection area, and the first circuit layer is embedded in the first surface. A photo imageabledielectric layer is formed on the electrical connection area, wherein the photo imageable dielectric layer has a plurality of openings, and the openings expose parts of the first circuit layer. A plurality of conductive bumps is formed on the electrical connection area through the openings, wherein each of the conductive bumps is connected to the first circuit layer, and the photo imageable dielectric layer covers at least a part of a side surface of each of the conductive bumps.

In an embodiment of the invention, the manufacturing method further includes forming a solder mask layer on the photo imageable dielectric layer, wherein the solder mask layer covers a part of the side surface of each of the conductive bumps.

In an embodiment of the invention, the manufacturing method further includes following steps. Before the solder mask layer is formed, a connection circuit is formed on the photo imageable dielectric layer, wherein the connection circuit connects two of the conductive bumps. While the solder mask layer is formed, the connection circuit is covered by the solder mask layer.

In an embodiment of the invention, the manufacturing method further includes a following steps. Before the conductive bumps are formed, a patterned photoresist layer is formed on the photo imageable dielectric layer and the chip disposing area, wherein the openings are exposed by the patterned photoresist layer.

According to the above descriptions, in the circuit board of the invention, the photo imageable dielectric layer is taken as the patterned photoresist layer, and a plurality of high density and high precision conductive bumps are formed on the substrate at one time through a plurality of openings of the photo imageable dielectric layer. Besides that the photo imageable dielectric layer serves as the patterned photoresist layer to form the conductive bumps in the manufacturing process of the circuit board, the photo imageable dielectric layer is also remained in the structure to serve as a dielectric structure covering the side surfaces of the conductive bumps after manufacturing of the circuit board is completed. In this way, the conductive bumps are avoided to be excessively exposed to the external environment, so as to decrease a chance that the conductive bumps are oxidized or eroded, and accordingly enhance a yield of the chip package products.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
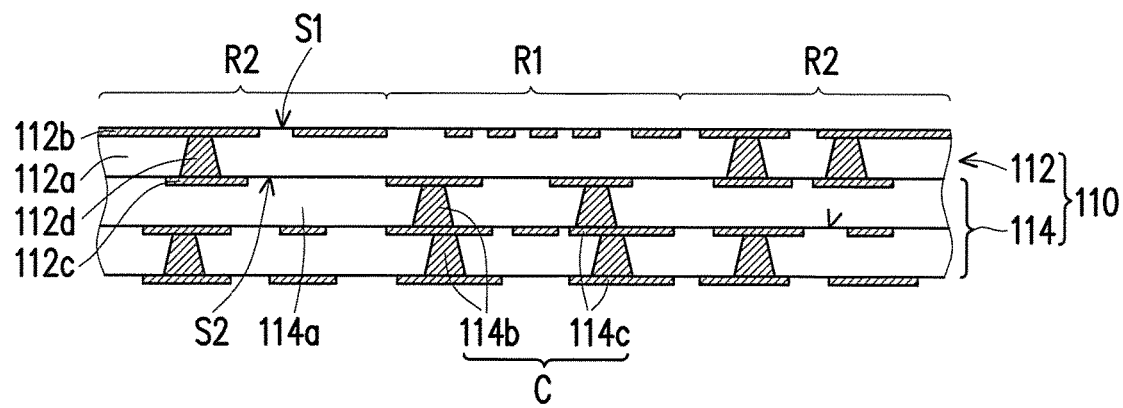
FIG. 1A to FIG. 1D illustrate a manufacturing flow of a circuit board according to an embodiment of the invention.

FIG. 1A to FIG. 1D illustrate a manufacturing flow of a circuit board according to an embodiment of the invention. Referring to FIG. 1A first, a substrate 110 is provided, the substrate 110 has a first surface S1 and a first circuit layer 112b, where the first surface S1 has a chip disposing area R1 and an electrical connection area R2 surrounding the chip disposing area R1, and the first circuit layer 112b is embedded in the first surface S1.

Figure 1B:
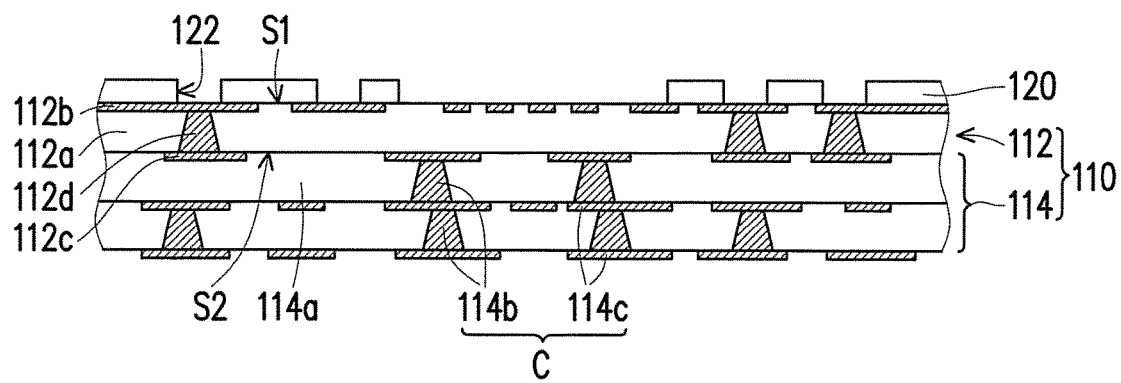
Figure 1C:
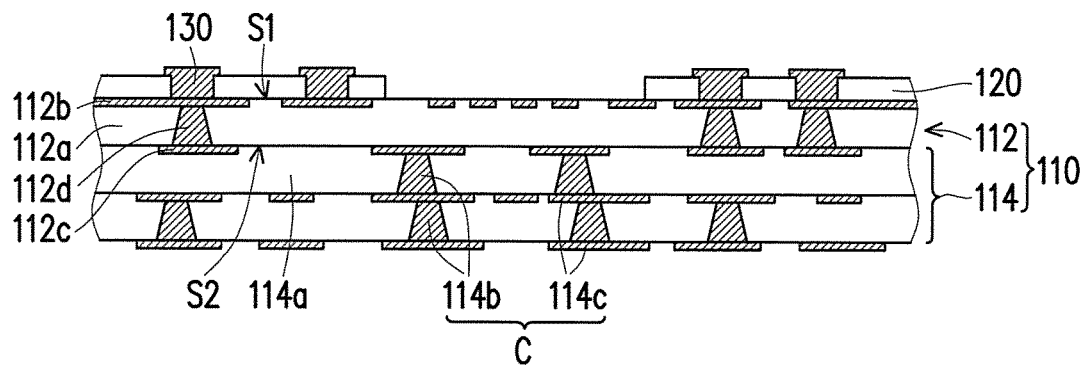

Then, as shown in FIG. 1B, a photo imageable dielectric layer 120 is formed on the electrical connection area R2, where the photo imageable dielectric layer 120 has a plurality of openings 122, and the openings 122 expose parts of the first circuit layer 112b. Then, as shown in FIG. 1C, a plurality of conductive bumps 130 is respectively formed on the electrical connection area R2 (indicated in FIG. 1A) through the openings 122, where each of the conductive bumps 130 is connected to the first circuit layer 112b, and the photo imageable dielectric layer 120 covers a part of a side surface of each of the conductive bumps 130.

A chip is adapted to be disposed on the chip disposing area R (indicated in FIG. 1A) of the substrate 110 for being packaged to form a chip package. When another chip package is stacked on the chip package, since the conductive bumps 130 supporting between the two packages have a certain height, an adequate space is provided between the two chip packages for accommodating the chip.

In the aforementioned manufacturing method of the embodiment, the photo imageable dielectric layer 120 is taken as a patterned photoresist layer, and a plurality of high density and high precision conductive bumps 130 is formed on the substrate 110 at one time through a plurality of openings 122 of the photo imageable dielectric layer 120. Besides that the photo imageable dielectric layer 120 serves as the patterned photoresist layer to form the conductive bumps 130 in the manufacturing process of the circuit board, the photo imageable dielectric layer 120 is also remained in the structure to serve as a dielectric structure covering the side surfaces of the conductive bumps 130 after manufacturing of the circuit board is completed. In this way, in case that the conductive bumps 130 have a certain height, the conductive bumps 130 are avoided to be excessively exposed to the external environment, so as to decrease a chance that the conductive bumps 130 are oxidized or eroded, and accordingly enhance a yield of the chip package products.

Figure 2A:
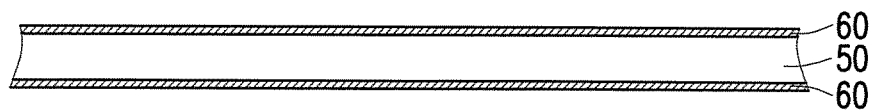
FIG. 2A and FIG. 2B illustrate a manufacturing flow of a substrate of FIG. 1A.
Figure 2B:
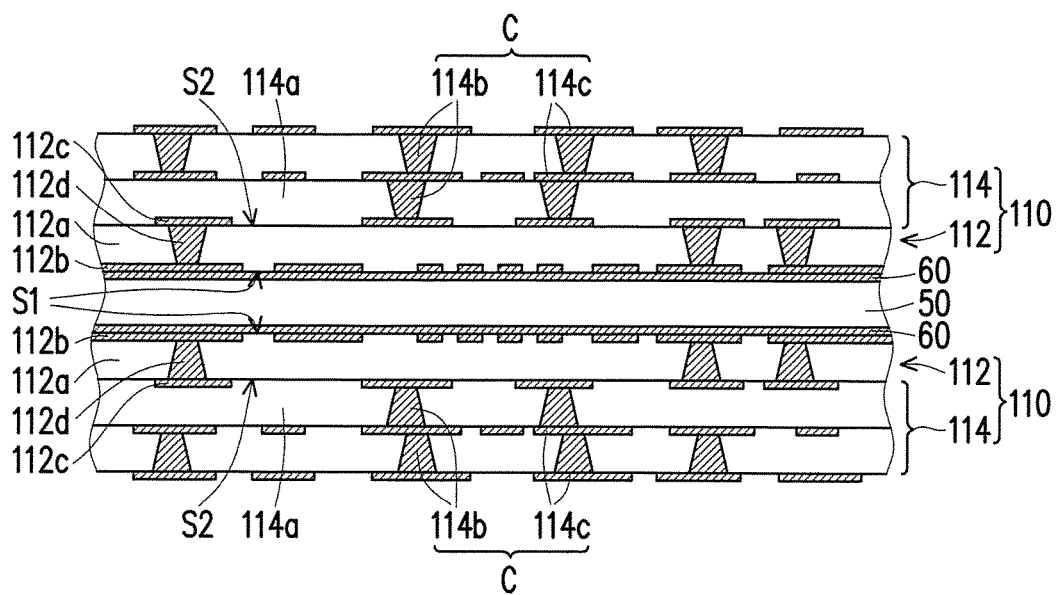

A manufacturing method of the substrate 110 of the present embodiment is described below. FIG. 2A and FIG. 2B illustrate a manufacturing flow of the substrate of FIG. 1A. Referring to FIG. 2A, a temporary carrier plate 50 is provided, in which two metal layers 60 are respectively formed at two opposite surfaces of the temporary carrier plate 50. Referring to FIG. 2B, two substrates 110 are respectively fabricated on the two metal layers 60 in an additive manner. The substrate 110 includes a base layer 112 and a built-up structure 114. The base layer 112 includes a first dielectric layer 112a, the first circuit layer 112b, a second circuit layer 112c and a plurality of conductive vias 112d, where the first dielectric layer 112a has a first surface S1 and a second surface S2 opposite to each other, the second circuit layer 112c is disposed on the second surface S2, and each of the first conductive vias 112d is located in the first dielectric layer 112a and connects the first circuit layer 112b and the second circuit layer 112c.

Further, the built-up structure 114 is formed on the second surface S2 and includes at least one second dielectric layer 114a, a conductive structure C formed on the second dielectric layer 114a, where the conductive structure C at least includes a plurality of second conductive vias 114b formed in the second dielectric layer 114a and extending to the second circuit layer 112c and a third circuit layer 114c formed on a part of the second dielectric layer 114a. In the present embodiment, the number of the second dielectric layers 114a is plural (two second dielectric layers 114a are illustrated), and the number of the third circuit layers 114c is plural (two third circuit layers 114c are illustrated). The second dielectric layers 114a and the third circuit layers 114c are stacked in alternation, and the second conductive vias 114b penetrate through the second dielectric layers 114a and electrically connect the third circuit layers 114c and the second circuit layer 112c. In other embodiments, the second dielectric layers 114a and the third circuit layers 114c may have other stacked layer numbers, which is not limited by the invention.

Figure 3:
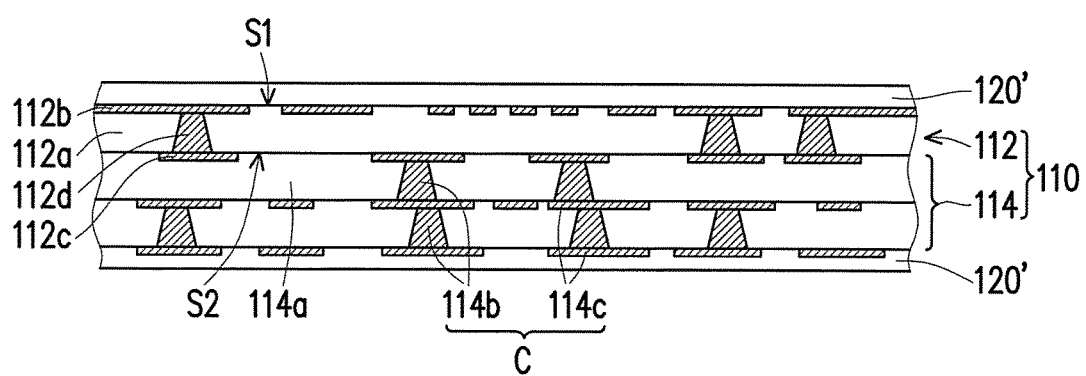
FIG. 3 illustrates a manufacturing flow of a photo imageable dielectric layer of FIG. 1B.

A manufacturing method of the photo imageable dielectric layer of the embodiment is introduced below. FIG. 3 illustrates a manufacturing flow of the photo imageable dielectric layer of FIG. 1B. Referring to FIG. 3, first, a complete photo imageable dielectric layer 120' is formed at two opposite sides of the substrate 110, such that the substrate 110 is covered by the photo imageable dielectric layer 120'. Then, parts of the photo imageable dielectric layer 120' is removed through an exposure and development process to form the patterned photo imageable dielectric layer 120 shown in FIG. 1B, such that parts of the first circuit layer 112b, the chip disposing area R1 (indicated in FIG. 1A) and a part of the substrate 110 are exposed.

Figure 4A:
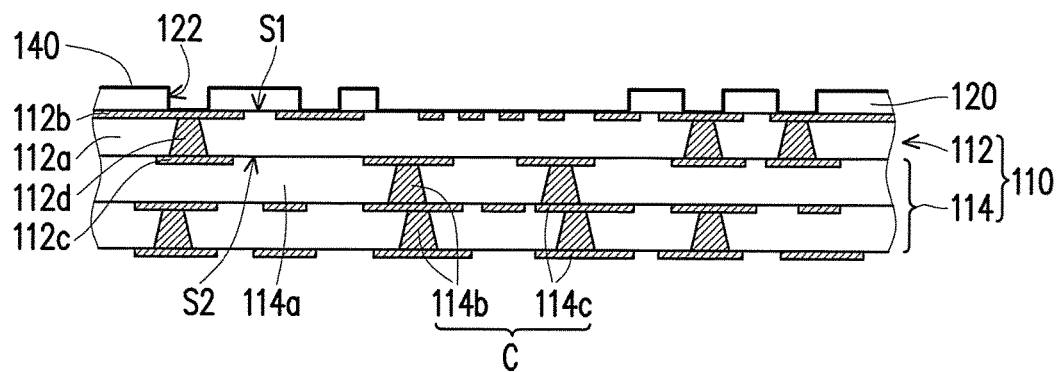
FIG. 4A and FIG. 4B illustrate a manufacturing flow of conductive bumps of FIG. 1C.
Figure 4B:
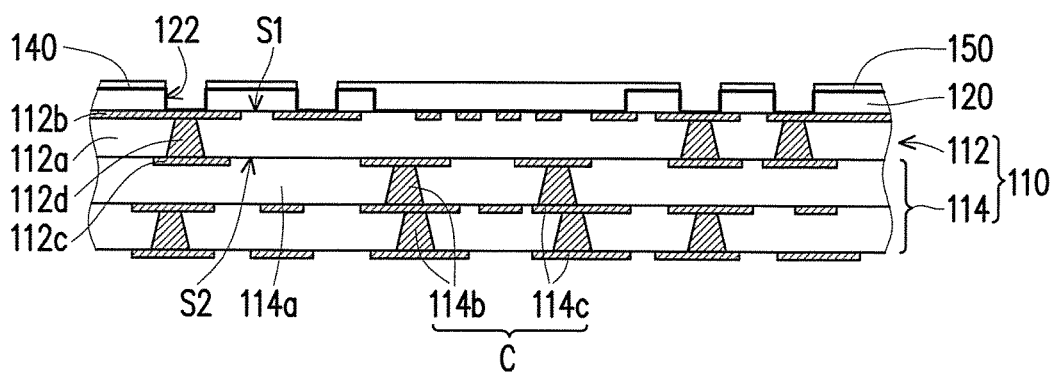

A detailed manufacturing method of the conductive bumps of the present embodiment is described below. FIG. 4A and FIG. 4B illustrate a manufacturing flow of the conductive bumps of FIG. 1C. After manufacturing of the photo imageabledielectric layer 120 of FIG. 1B is completed, an electroplating seed layer 140 is formed on the photo imageable dielectric layer 120 and the first surface S1 of the substrate 110. Then, before the conductive bumps 130 of FIG. 1C are formed, as shown in FIG. 4B, a patterned photoresist layer 150 shown is formed on the photo imageable dielectric layer 120 and the electroplating seed layer 140 on the chip disposing area R1 (indicated in FIG. 1A), where the patterned photoresist layer 150 exposes the electroplating seed layer 140 at the openings 122 of the photo imageable dielectric layer 120. Then, the conductive bumps 130 are formed at the openings 122 exposed by the patterned photoresist layer 150 through an electroplating process, and the patterned photoresist layer 150 is removed to complete the structure shown in FIG. 1C.

Figure 1D:
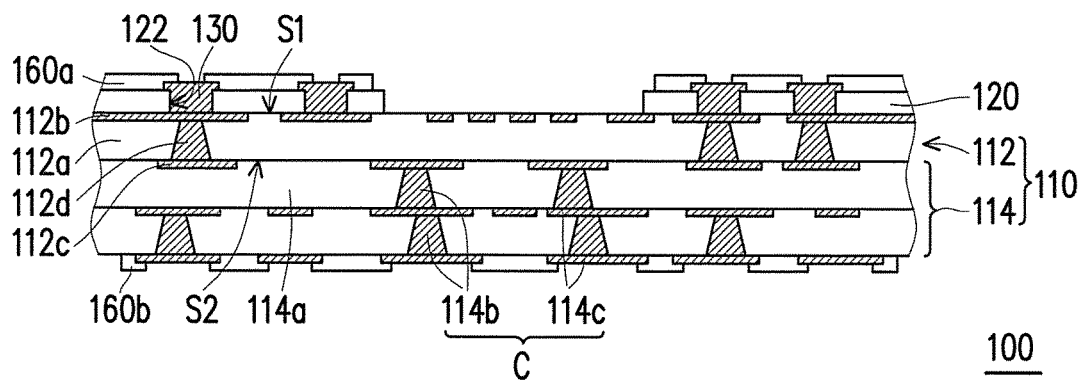

After the structure shown in FIG. 1C is completed, as shown in FIG. 1D, a solder mask layer 160a can be formed on the photo imageable dielectric layer 120 located at one side of the substrate 110, and a solder mask layer 160b can be formed on the other side of the substrate 110 to complete manufacturing the circuit board 100. The solder mask layer 160a and the solder mask layer 160b respectively expose the conductive bumps 130 and parts of the third circuit layer 114c, such that the circuit board 100 is adapted to be electrically connected to the other members through the conductive bumps 130 and the part of the third circuit layers 114c.

Figure 5:
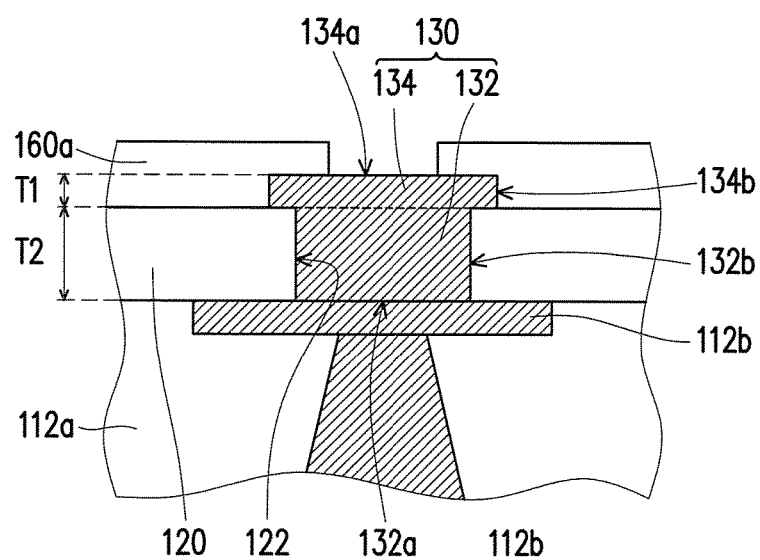
FIG. 5 is a partial enlarged view of the circuit board of FIG. 1D at a conductive bump.

FIG. 5 is a partial enlarged view of the circuit board of FIG. 1D at the conductive bump. Referring to FIG. 5, in detail, the conductive bump 130 of the present embodiment includes an embedded portion 132 and a pad portion 134, where the embedded portion 132 is located in the corresponding opening 122, and the pad portion 134 is connected to the embedded portion 132 and is located outside the corresponding opening 122. The conductive bump 130 has a top surface 134a at the pad portion 134, and the top surface 134a is exposed by the solder mask layer 160a and is adapted to electrically connect other members. The conductive bump 130 has a bottom surface 132a opposite to the top surface 134a at the embedded portion 132, and the bottom surface 132a is used for connecting the first circuit layer 112b. The conductive bump 130 further has a side surface connecting the top surface 134a and the bottom surface 132a, and the side surface is composed of a side surface 134b of the pad portion 134 and a side surface 132b of the embedded portion 132. The photo imageable dielectric layer 120 covers a part of the side surface of the conductive bump 130 (i.e. the side surface 132b of the embedded portion 132), and the solder mask layer 160a covers the other part of the side surface of the conductive bump 130 (i.e. the side surface 134b of the pad portion 134). In this way, the side surface of the conductive bump 130 is completely covered by the photo imageable dielectric layer 120 and the solder mask layer 160a, so as to further decrease a chance that the conductive bump 130 is oxidized or eroded.

In the present embodiment, a thickness T1 of the pad portion 134 is, for example, smaller than a thickness T2 of the embedded portion 132. To be specific, the thickness T1 of the pad portion 134 is, for example, smaller than 30 μm. However, the invention is not limited thereto, and in other embodiments, the pad portion 134 and the embedded portion 132 may have other suitable thickness.

Figure 6A:
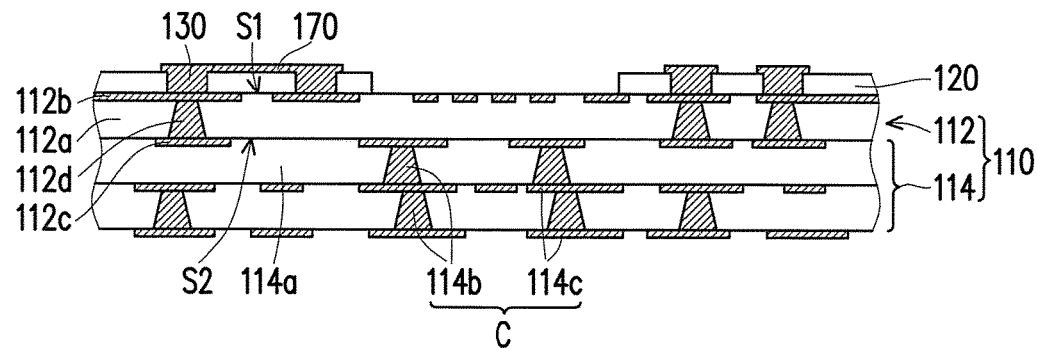
FIG. 6A and FIG. 6B illustrate a manufacturing flow of a circuit board according to another embodiment of the invention.
Figure 6B:
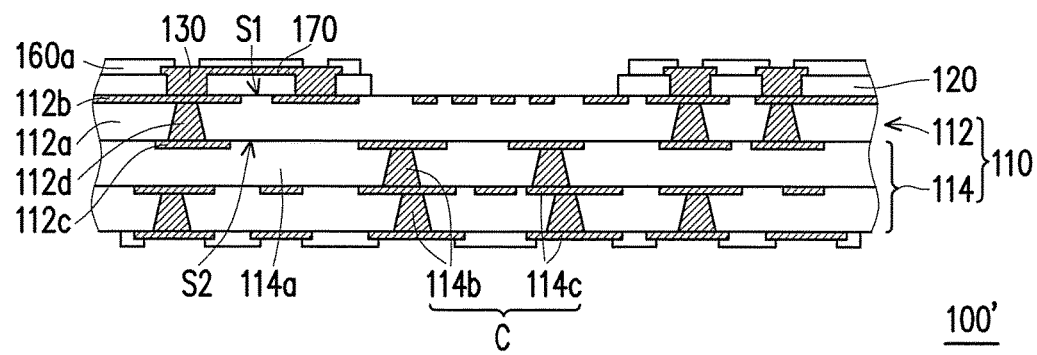

FIG. 6A and FIG. 6B illustrate a manufacturing flow of a circuit board according to another embodiment of the invention. As shown in FIG. 1D, before the solder mask layer 160a is formed, a connection circuit 170 can be first formed on the photo imageable dielectric layer 120 as that shown in FIG. 6A, and the connection circuit 170 connects two conductive bumps 130. Then, while the solder mask layer 160a is formed, as shown in FIG. 6B, the solder mask layer 160a covers the connection circuit 170 to complete manufacturing of the circuit board 100'. In other embodiments, more connection circuits 170 can be formed to connect other conductive bumps 130 according to an actual requirement, or the connection circuit 170 is not formed, which is not limited by the invention.

In summary, in the circuit board of the invention, the photo imageabledielectric layer is taken as the patterned photoresist layer, and a plurality of high density and high precision conductive bumps is formed on the substrate at one time through a plurality of openings of the photo imageable dielectric layer. Besides that the photo imageable dielectric layer serves as the patterned photoresist layer to form the conductive bumps in the manufacturing process of the circuit board, the photo imageable dielectric layer is also remained in the structure to serve as a dielectric structure covering the side surfaces of the conductive bumps after manufacturing of the circuit board is completed. In this way, in case that the conductive bumps have a certain height, the conductive bumps are avoided to be excessively exposed to the external environment, so as to decrease a chance that the conductive bumps are oxidized or eroded, and accordingly enhance a yield of the chip package products.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A circuit board, comprising:
   a substrate, having a first surface and a first circuit layer, wherein the first surface has a chip disposing area and an electrical connection area, and the first circuit layer is embedded in the first surface;
   a photo imageable dielectric layer, disposed on the electrical connection area and having a plurality of openings, wherein the openings expose parts of the first circuit layer, and the photo imageable dielectric layer exposes the chip disposing area; and
   a plurality of conductive bumps, respectively disposed at the openings, and connected to the first circuit layer, wherein the photo imageable dielectric layer covers at least a part of a side surface of each of the conductive bumps.

2. The circuit board as claimed in claim 1, further comprising:
   a solder mask layer, disposed on the photo imageable dielectric layer, and covering a part of the side surface of each of the conductive bumps.

3. The circuit board as claimed in claim 2, further comprising:
   a connection circuit, disposed on the photo imageable dielectric layer and connecting two of the conductive bumps, wherein the solder mask layer covers the connection circuit.

4. The circuit board as claimed in claim 1, wherein each of the conductive bumps comprises an embedded portion and a pad portion, wherein the embedded portion is located in the corresponding opening, the pad portion is connected to the embedded portion and located outside the corresponding opening, and a thickness of the pad portion is smaller than 30 µm.

5. The circuit board as claimed in claim 1, wherein each of the conductive bumps comprises an embedded portion and a pad portion, wherein the embedded portion is located in the corresponding opening, the pad portion is connected to the embedded portion and located outside the corresponding opening, and a thickness of the pad portion is smaller than a thickness of the embedded portion.

6. The circuit board as claimed in claim 1, wherein the substrate comprises:
  a base layer, comprising a first dielectric layer, the first circuit layer, a second circuit layer and a plurality of first conductive vias, wherein the first dielectric layer has a first surface and a second surface opposite to each other, the second circuit layer is disposed on the second surface, and each of the first conductive vias is located in the first dielectric layer and connects the first circuit layer and the second circuit layer; and
  a built-up structure, formed on the second surface, and comprising at least one second dielectric layer and a conductive structure formed on the second dielectric layer, wherein the conductive structure at least comprises a plurality of second conductive vias formed in the second dielectric layer and extending to the second circuit layer and a third circuit layer formed on a part of the second dielectric layer.

7. A manufacturing method of a circuit board, comprising:
  providing a substrate having a first surface and a first circuit layer, wherein the first surface has a chip disposing area and an electrical connection area, and the first circuit layer is embedded in the first surface;
  forming a photo imageable dielectric layer on the electrical connection area, wherein the photo imageable dielectric layer has a plurality of openings, the openings expose parts of the first circuit layer, and the photo imageable dielectric layer exposes the chip disposing area; and
  forming a plurality of conductive bumps on the electrical connection area through the openings, wherein each of the conductive bumps is connected to the first circuit layer, and the photo imageable dielectric layer covers at least a part of a side surface of each of the conductive bumps.

8. The manufacturing method of the circuit board as claimed in claim 7, further comprising:
  forming a solder mask layer on the photo imageable dielectric layer, wherein the solder mask layer covers a part of the side surface of each of the conductive bumps.

9. The manufacturing method of the circuit board as claimed in claim 8, further comprising:
  forming a connection circuit on the photo imageable dielectric layer before the solder mask layer is formed, wherein the connection circuit connects two of the conductive bumps; and
  covering the connection circuit by the solder mask layer while the solder mask layer is formed.

10. The manufacturing method of the circuit board as claimed in claim 7, further comprising:
  forming a patterned photoresist layer on the photo imageable dielectric layer and the chip disposing area before the conductive bumps are formed, wherein the openings are exposed by the patterned photoresist layer.

* * * * *